(12) United States Patent
Van Schuylenbergh et al.

(10) Patent No.: US 7,985,081 B2
(45) Date of Patent: Jul. 26, 2011

(54) TRANSFERABLE MICRO SPRING STRUCTURE

(75) Inventors: Koenraad Van Schuylenbergh, Sunnyvale, CA (US); Thomas Hantschel, Menlo Park, CA (US)

(73) Assignee: Palo Alto Research Center Incorporated, Palo Alto, CA (US)

(*) Notice: Subject to any disclaimer, the term of this patent is extended or adjusted under 35 U.S.C. 154(b) by 433 days.

(21) Appl. No.: 12/167,972

(22) Filed: Jul. 3, 2008

(65) Prior Publication Data

US 2008/0268669 A1    Oct. 30, 2008

Related U.S. Application Data

(62) Division of application No. 10/741,461, filed on Dec. 19, 2003, now Pat. No. 7,410,590.

(51) Int. Cl.
*H05K 1/00* (2006.01)
*C23C 14/34* (2006.01)

(52) U.S. Cl. .......... 439/81; 439/66; 439/67; 204/192.15

(58) Field of Classification Search ............... 439/81, 439/66, 67
See application file for complete search history.

(56) References Cited

U.S. PATENT DOCUMENTS

| | | |
|---|---|---|
| 3,842,189 A | 10/1974 | Southgate |
| 3,952,404 A | 4/1976 | Matunami |
| 4,189,342 A | 2/1980 | Kock |
| 5,221,415 A | 6/1993 | Albrecht et al. |
| 5,280,139 A | 1/1994 | Suppelsa et al. |
| 5,613,861 A | 3/1997 | Smith et al. |
| 5,665,648 A | 9/1997 | Little |
| 5,848,685 A | 12/1998 | Smith et al. |
| 5,914,218 A | 6/1999 | Smith et al. |
| 5,944,537 A | 8/1999 | Smith et al. |
| 5,979,892 A | 11/1999 | Smith |
| 6,184,065 B1 | 2/2001 | Smith et al. |
| 6,184,699 B1 | 2/2001 | Smith et al. |
| 6,213,789 B1 | 4/2001 | Chua et al. |
| 6,252,175 B1 | 6/2001 | Khandros |
| 6,290,510 B1 | 9/2001 | Fork et al. |
| 6,640,432 B1 * | 11/2003 | Mathieu et al. ............... 29/842 |
| 6,658,728 B2 | 12/2003 | Fork et al. |
| 6,794,737 B2 * | 9/2004 | Romano et al. ............ 257/669 |
| 6,835,589 B2 | 12/2004 | Pogge et al. |
| 2002/0013070 A1 | 1/2002 | Fork et al. |
| 2003/0010615 A1 | 1/2003 | Fork et al. |

FOREIGN PATENT DOCUMENTS

WO    WO 01/48870 A2    7/2001

* cited by examiner

*Primary Examiner* — Rodney G McDonald
(74) *Attorney, Agent, or Firm* — Bever, Hoffman & Harms, LLP; Patrick T. Beaver

(57) ABSTRACT

A method for mounting the micro spring structures onto cables or contact structures includes forming a spring island having an "upside-down" stress bias on a first release material layer or directly on a substrate, forming a second release material over at least a portion of the spring island, and then forming a base structure over the second release material layer. The micro spring structure is then transferred in an unreleased state, inverted such that the base structure contacts a surface of a selected apparatus, and then secured (e.g., using solder reflow techniques) such that the micro spring structure becomes attached to the apparatus. The spring structure is then released by etching or otherwise removing the release material layer(s).

20 Claims, 3 Drawing Sheets

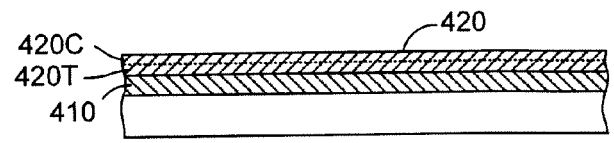
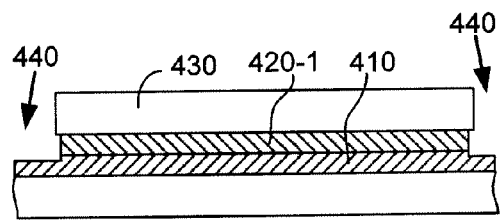
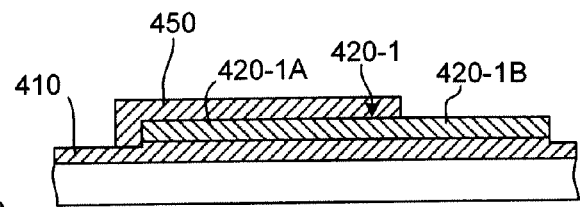
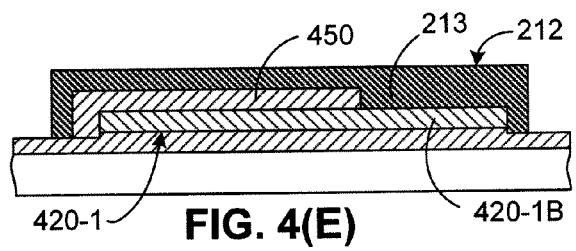
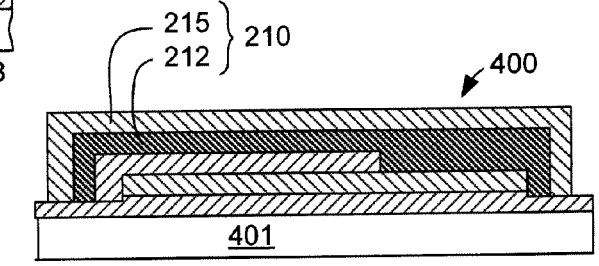
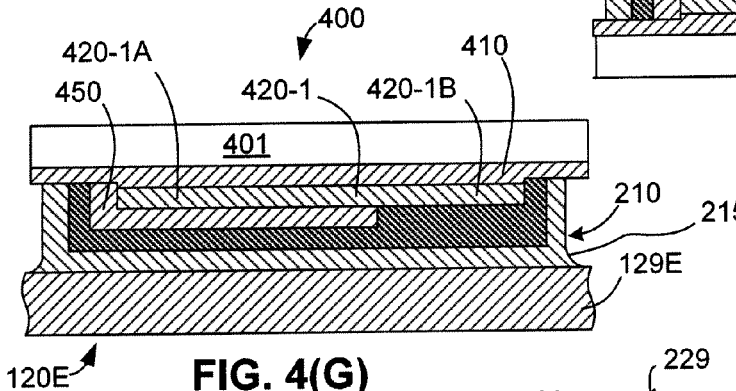
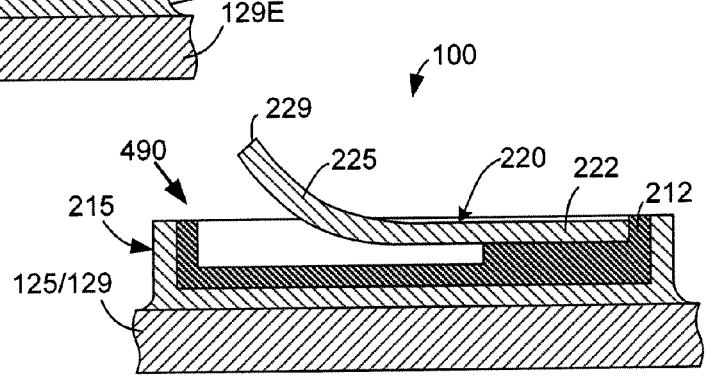

TRANSFERABLE MICRO SPRING STRUCTURE

RELATED APPLICATIONS

This application is a divisional of U.S. patent application Ser. No. 10/741,461, entitled "Transferable Micro Spring Structure" filed Dec. 19, 2003 now U.S. Pat. No. 7,410,590.

FIELD OF THE INVENTION

This invention generally relates to stress-engineered metal films, and more particularly to photo lithographically patterned micro-spring structures formed from stress-engineered metal films.

BACKGROUND OF THE INVENTION

Photolithographically patterned micro spring structures (sometimes referred to as "microsprings") have been developed, for example, to produce low cost probe cards, and to provide electrical connections between integrated circuits. A typical spring structure includes a spring finger having an anchor portion secured to a substrate, and a free (cantilevered) portion extending from the anchored portion over the substrate. The spring finger is formed from a stress-engineered film (i.e., a (e.g., metal) film fabricated such that portions closer to the underlying substrate have a higher internal compressive stress than its portions located farther from the substrate) that is at least partially formed on a release material layer. The free portion of the spring finger bends away from the substrate when the release material located under the free portion is etched away. The internal stress gradient is produced in the spring by layering, e.g., different metals having the desired stress characteristics, or by using a single metal by altering the fabrication parameters. Such spring structures may be used in probe cards, for electrically bonding integrated circuits, circuit boards, and electrode arrays, and for producing other devices such as inductors, variable capacitors, and actuated mirrors. For example, when utilized in a probe card application, the tip of the free portion is brought into contact with a contact pad formed on an integrated circuit, and signals are passed between the integrated circuit and test equipment via the probe card (i.e., using the spring structure as a conductor). Other examples of such spring structures are disclosed in U.S. Pat. No. 3,842,189 (Southgate) and U.S. Pat. No. 5,613,861 (Smith).

A problem associated with the manufacture of various products including micro spring structures is that the conventional micro spring fabrication processes require either physically locating the product into the associated micro spring structure manufacturing tool (e.g., a sputter deposition chamber), or pre-fabricating the micro spring structures on a substrate, and then securing the substrate to the product (i.e., such that the substrate is located between the spring structures and the product). For example, in order to produce a flexible cable having micro spring structures located on the cable's conductors, the flexible cable must either be inserted into the manufacturing tool, or the micro spring structures must be pre-fabricated on a conductive substrate that is then mounted onto the exposed conductors of the cable. Placing the flexible cable in the manufacturing tool increases production complexity (i.e., the flexible cable must be able to survive the fabrication process), and significantly decreases production efficiency due to the large amount of space needed to accommodate the flexible cable. Conversely, pre-fabrication requires releasing the micro spring structures, and then transferring the released spring structures to an assembly point, this process greatly increasing the risk of damaging the relatively fragile microspring structures. Further, because the substrate on which the spring structures are formed is mounted on the selected product, either the substrate must be formed with integrated conductive and/or insulated regions, or the substrate must be diced into very small pieces prior to the mounting process. In either case, the cost and complexity of producing products having micro spring structures is greatly increased, thereby significantly reducing manufacturing efficiencies and greatly increasing manufacturing costs.

What is needed is a method for transferring pre-fabricated micro spring structures that both protects the relatively fragile spring structure, and facilitates a relatively simple and reliable process for mounting the spring structures onto a selected product.

SUMMARY OF THE INVENTION

The present invention is directed to a pre-fabricated micro spring structure that includes a stress-engineered spring formed on a substrate, and a base structure formed over the stress-engineered spring. Instead of mounting the substrate to a selected product, the micro spring structure is inverted, and the base structure is mounted onto the selected product using, for example, standard solder reflow techniques. The springs remain unreleased during the transport and assembly process, thereby protecting the relatively fragile stress-engineered spring during these processes, which greatly increases production efficiencies. The substrate is then removed and the stress-engineered spring is released, thereby providing a simple and reliable process for mounting the spring structures onto a selected product.

In accordance with an embodiment of the present invention, a method is provided for producing an apparatus (e.g., the exposed conductor tips of a flexible cable) including a micro spring structure in a manner than minimizes the risk of damage to the relatively fragile micro spring structures during production. The micro spring structure is pre-fabricated by forming a release material layer on a substrate, then forming a spring material island (i.e., unreleased strip of spring material) on the release material layer such that the spring material island has an "upside-down" stress gradient (i.e., such that the subsequently released micro spring finger would bend downward instead of away from the underlying substrate). A release material pad is then formed over a free (first) portion of the spring material island, and a base structure is formed over the release material pad and an anchor (second) portion of the spring material island. The entire structure is then transferred to a desired location, inverted such that the base structure faces a surface of an apparatus to which the micro spring structure is to be attached, and then the base structure is secured (e.g., using solder or a conductive adhesive) to the apparatus surface of the apparatus (i.e., such that the substrate is located above the spring finger). A suitable etchant is then used to remove the release material, which causes the substrate to separate from the spring island, and causes the free end of the spring island to release from the base structure and to bend away from the substrate due to the internal stress gradient, thereby providing a low-cost apparatus including the micro spring structure, while minimizing the risk of damage to the micro spring structure during the transfer process.

In accordance with another embodiment, the spring material island is formed directly onto the substrate (or via an adhesive), and the substrate separation and spring release process involves the separate steps of peeling, etching away, or otherwise removing the substrate, and then etching the release material to release the spring structure. Alternatively, different release materials may be utilized above and below the spring structure (e.g., using a relatively weak release material to facilitate relatively easy removal of the substrate, and a relatively strong release material that is then etched to release the spring structures).

In accordance with a yet another embodiment of the present invention, multiple micro spring structures are formed in a predefined pattern on substrate, and then the substrate is inverted and the micro spring structures are mounted onto corresponding contact pads provided on a target apparatus, where the contact pads are arranged to "mirror" the predefined pattern. The multiple micro spring structures are then secured and released (and the substrate removed) in the manner described above. Accordingly, the present invention provides a relatively simple and reliable method for producing an apparatus including a large number of electrically-isolated micro spring structures.

BRIEF DESCRIPTION OF THE DRAWINGS

These and other features, aspects and advantages of the present invention will become better understood with regard to the following description, appended claims, and accompanying drawings, where:

FIGS. 4(A) through 4(H) are cross-sectional side views depicting portions of a fabrication method for producing and mounting the micro spring structure shown in FIG. 3;

DETAILED DESCRIPTION OF THE DRAWINGS

The present invention is described below with reference to specific examples in which micro spring structures are mounted onto flexible cables and printed circuit boards. While these examples illustrate a practical use for the present invention, the disclosed examples are intended to be exemplary, and not intended to limit the appended claims unless otherwise specified. In particular, those skilled in the art will understand that the methods and micro spring structures of the present invention can be modified to produce a wide range of products with various micro spring and other Micro Electro Mechanical System (MEMS) structures (e.g., bimorphs) formed thereon.

Figure 1:
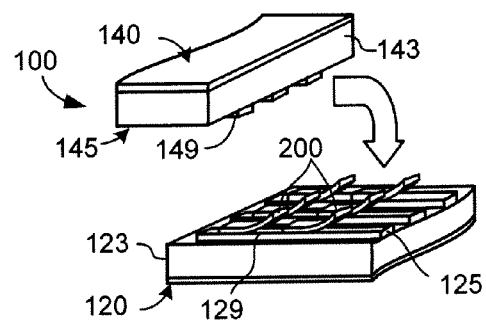
FIG. 1 is a simplified perspective view showing an apparatus including a plurality of micro spring structures.
Figure 2:
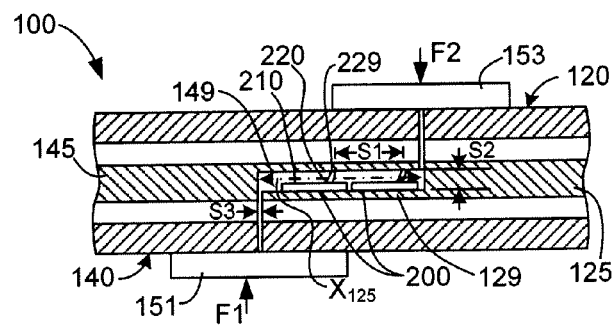
FIG. 2 is cross-sectional side view showing the apparatus of FIG. 1.

FIGS. 1 and 2 are perspective and cross-sectional side views showing portions of an interconnect assembly 100 according to a specific embodiment of the present invention. In particular, FIGS. 1 and 2 show portions of a first flexible cable 120 and a second flexible cable 140. Flexible cables 120 and 140 are, for example, surface microstrip-type flexible flat cables or stripline-type flexible flat cables. Note that the specific structures associated with flexible flat cable 120 are intended to be exemplary, and not intended to limit the appended claims unless otherwise specified.

First flexible cable 120 includes conductors 125, each having an exposed (tip) portion 129 located adjacent to a free end 123 of flexible cable 120, and second flexible cable 140 includes conductors 145, each having exposed (tip) portions 149 located adjacent to free end 143 of flexible cable 140. As indicated in FIG. 2, an optional connector structure, which is generally indicated by a first portion 151 and a second portion 153, is utilized to secure first flexible cable 120 to second flexible cable 140 such that each conductor 125 is electrically connected to an associated conductor 145 in the manner described below.

In accordance with an aspect of the present invention, several conductive micro spring structures 200, which are interface members that are fabricated in the manner described below, are provided on cable 120 to produce an interface arrangement that is low resistance (i.e., less than 1Ω, and more preferably less than 50 mΩ), mechanically compliant to absorb conductor height variations, mechanically tolerant (i.e., resistant to shock and vibration-induced damage), and which provides redundant contact points between conductors 125 and 145. In addition, by positioning micro spring fingers 200 on the exposed portion 129 and by accurately aligning and mating this portion 129 to the corresponding portion 149, the present embodiment facilitates highly efficient signal transfer between flexible cables 120 and 140 by providing an interconnect assembly that maintains a uniform impedance and EM field distribution with respect to the signal and ground conductors throughout the connector-cable interfaces with artifacts that only occur in regions that are smaller (i.e., narrower) than a fraction of the signal wavelength. More specifically, detailed finite element modeling demonstrated that the micro spring structures 200 should be spaced apart in the direction of the wave propagation by no more than a fifth of the signal wavelength (i.e., with a tip-to-tip spacing S1 as shown in FIG. 2). Although indicated with the micro spring structures bent for illustrative purposes, the mating portions 129 and 149 are preferably fully compressed against each other with the micro spring structures rolled out flat, leaving no air gap in between. The finite element modeling showed that an air layer S2 (FIG. 2) that is thinner than $\frac{1}{50}^{th}$ of a signal wavelength is acceptable. A maximum gap S3 of $\frac{1}{25}^{th}$ between the butting cable ends in the direction of the wave propagation was also found acceptable. The latter corresponds to about 100 μm at 50 GHz indicating that the cable ends can be trimmed by conventional flex circuit manufacturing techniques. The acceptability criterion used to determine the above margins was a maximal artifact of 1 dB in the $S_{12}$ transfer characteristic and the $S_{11}$ reflection characteristic.

Figure 3:
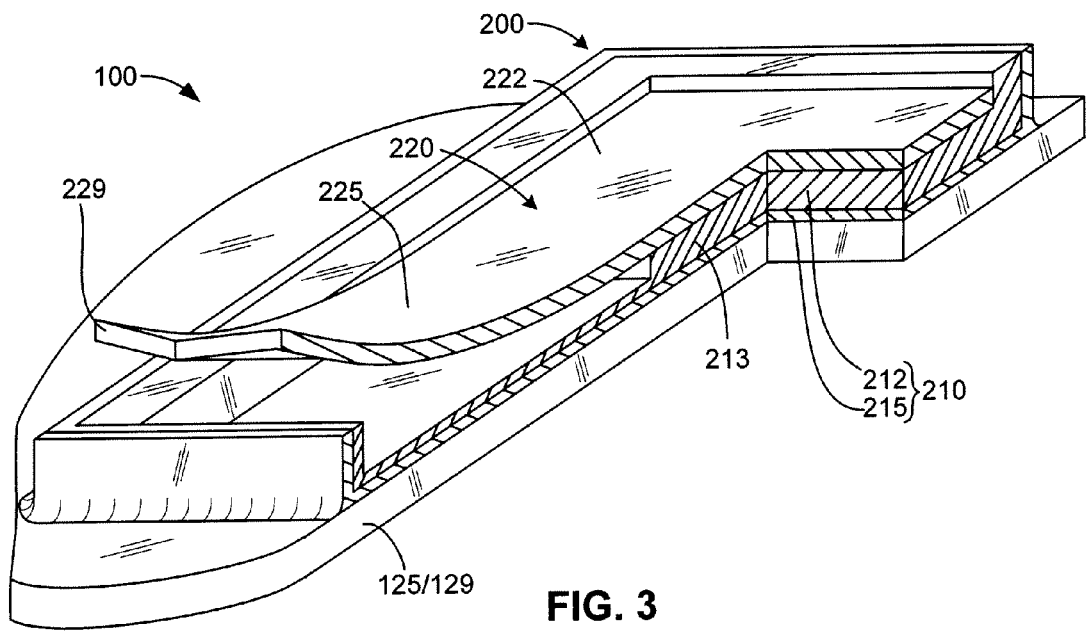
FIG. 3 is a cut-away perspective view of a micro spring structure according to an embodiment of the present invention.

As indicated in FIGS. 2 and 3, conductive micro spring structures 200 include base structures 210 and spring fingers 220 that bend away from conductor 125 of first cable 120 to facilitate reliable contact with corresponding conductor 145 of second cable 140. Note that the specific structure of micro spring structures 200 disclosed herein is intended to be exemplary, and not limiting unless otherwise specified in the claims. As indicated in FIG. 3, each base portion 210 includes an inner frame 212 and an outer contact portion 215, and each spring finger 220 includes an anchor portion 222 and a free portion 225 defining a tip 229. Anchor portion 222 of each micro spring finger 220 is attached to a support portion 213 of inner frame 212 such that anchor 222 extends parallel to the surface of exposed portion 129 (i.e., parallel to axis $X_{125}$; see FIG. 2). Free portion 225 of each micro spring finger 220 extends from anchor portion 222, and is "released" (detached) from inner frame 212 and underlying conductor 125 (i.e., not adhered or otherwise secured, but may be in contact).

As described in detail below, micro spring fingers 220 are produced such that an internal stress gradient biases free portions 225 away from base structure 210 and flexible cable 120, thereby producing the indicated curved shape that points tips 229 in a direction away from exposed portion 129 of conductor 125. As depicted in FIG. 2, when second cable 140 is positioned over and pressed against first flexible cable 120 (e.g., by forces F1 and F2 respectively exerted by connector structure portions 151 and 153), tips 229 contact exposed portions 149 of flexible cable 140, thereby providing a multi-contact interface arrangement that facilitates reliable signal transmissions between conductors 125 and 145.

FIGS. 4(A) to 4(H) are simplified cross-sectional side views showing a method for producing a flexible cable having a micro spring structure mounted thereon according to another embodiment of the present invention. Again, while the novel production method is described with reference to flexible cables, it is noted that this method may be utilized to produce a wide range of apparatus.

Referring to FIG. 4(A), the method begins by forming (e.g., sputtering) an optional release material layer 410 (e.g., Ti) to a thickness of approximately 0.05 microns or greater on a substrate 401. Because substrate 401 is ultimately separated from the spring structure and discarded, substrate 401 may be formed using a material that facilitates the selected separation process (e.g., a rigid material when etch-separation is used, an easily etched material (e.g., silicon) when the substrate is etched away, and a flexible film when peeling is utilized during separation). In addition to titanium, other release materials having the beneficial characteristics of titanium may also be used to form release layer 410. In other embodiments, release material layer 410 includes another metal, such as aluminum (Al), or a non-conducting material such as silicon (Si) or silicon nitride (SiN). Further, two or more release material layers can be sequentially deposited to form a multi-layer structure. In yet another possible embodiment, any of the above-mentioned release materials can be sandwiched between two non-release material layers (i.e., materials that are not removed during the spring release process, described below). Note that substrate 401 is ultimately discarded, and therefore can be formed using low-cost and/or non-conductive materials (e.g., a suitable heat-resistant plastic).

Subsequently, as shown in FIGS. 4(B) and 4(C), a stressed spring island 420-1 is formed, for example, by sputtering or plating a spring material layer 420 onto release layer 410 (or directly onto substrate 401 when release layer 410 is absent), and then utilizing a mask 430 to etch exposed portions of the spring material. In one embodiment, spring material layer 420 is a stress-engineered film formed such that it includes internal stress variations in the growth direction (that is, the internal stress varies in proportion to its vertical thickness or distance from the release layer 410). Methods for generating internal stress variations in spring material film 420 are taught, for example, in U.S. Pat. No. 3,842,189 (depositing two metals having different internal stresses) and U.S. Pat. No. 5,613,861 (e.g., single metal sputtered while varying process parameters), both of which being incorporated herein by reference. In one embodiment, stress-engineered spring material film 420 includes one or more metals suitable for forming a micro spring finger (e.g., one or more of molybdenum (Mo), a "moly-chrome" alloy (MoCr), tungsten (W), a titanium-tungsten alloy (Ti:W), chromium (Cr), nickel (Ni), zirconium (Zr), and alloys thereof). Suitable stress-engineered spring material is also formed by plating at least one of nickel (Ni), chromium (Cr), cobalt (Co), rhodium (Rh), gold (Au), copper (Cu) tin (Sn), zinc (Zn), and palladium (Pd). In other embodiments, spring material film 420 is formed using Si, nitride, oxide, carbide, or diamond that is subsequently coated with a conductive material (e.g., Au (gold)). The thickness of spring material film 420 is determined in part by the selected spring material, an applied coating (when used), and the desired spring constant and shape of the final micro spring finger.

Note that, unlike typical conventional micro spring fabrication methods (i.e., where the micro spring finger is biased away from the underlying substrate), the stress gradient of spring material layer 420 is formed "upside-down" (i.e., such that a relatively tensile region 420T is located adjacent release layer 410, and a relatively compressive region 420C is located above tensile region 420T). Those skilled in the art will recognize that this "upside-down" fabrication process involves reversing the stress or strain producing process described in typical references (e.g., gradually decreasing, instead of increasing, chamber pressure during deposition/sputtering of the spring material).

Etching (FIG. 4(C)) is performed, for example, using cerric ammonium nitrate solution to selectively remove exposed MoCr spring material. In another possible embodiment, the etching step can be performed using the electro-chemical etching process described in IBM J. Res. Dev. Vol. 42, No. 5, page 655 (Sep. 5, 1998), which is incorporated herein by reference. In addition, more than one mask may be used to form spring island 420-1 and release material island 410-1. Many additional process variations and material substitutions are therefore possible and the examples given are not intended to be limiting.

Next, as indicated in FIG. 4(D), a (second) release material portion 450 (e.g., Ti) is patterned over a (first) portion 420-1A of spring island 420-1 using known techniques. As indicated below, a second portion 420-1B of spring material that is not covered by release material portion 450 serves as the anchor portion in the released micro spring structure.

Referring to FIGS. 4(E) and 4(F), base structure 210 is then formed over an exposed (second) portion 420-1B of spring island 420-1 and release material portion 450, thereby completing an unreleased spring structure 400 according to an aspect of the present invention. As indicated in FIG. 4(E), according to one embodiment, inner frame 212 is formed over portion 420-1B and release material portion 450 is then formed, for example, by sputtering a seed layer over the expose structures, and then utilizing known electroplating or electroless plating techniques. In one embodiment, inner frame 212 is formed using (Cu)—Ni—Au alloy, where the use of copper in the (Cu)—Ni—Au is optional. Next, as indicated in FIG. 4(F), outer contact portion 215 (e.g. a solder layer or conductive adhesive) is formed (e.g., plated, stenciled, or screen printed) on inner frame 212 to complete base structure 210. In an alternative embodiment (not shown), a resist mask may be used to limit the structure covered by inner frame 212 and outer contact portion 215. Note that, in an alternative embodiment, the base structure includes only the inner frame, and the solder (or other conductive adhesive) is provided on the apparatus to which the base structure is attached.

According to another aspect of the present invention, the structure shown in FIG. 4(F) (i.e., one or more unreleased spring structures 400 mounted on "sacrificial" substrate 401) provides a highly reliable article of manufacture that can be used to reliably transfer and mount micro spring structures onto a target apparatus in the manner described below. Note that an optional dicing process (not shown), using known techniques, may then be utilized to separate substrate 401 into predetermined sections for transfer to one or more apparatus.

Referring to FIG. 4(G), after transferring unreleased spring structure 400 to a suitable assembly location, substrate 401 is then inverted and structure 400 is mounted onto the surface of the selected apparatus (e.g., an exposed conductor portion 129 of a cable 120). Base structure 210 is then secured to exposed conductor portion 129, for example, by reflowing the solder-based outer contact portion 215 using known techniques. Note that spring island 420-1 is now positioned between exposed cable portion 129 and substrate 401.

Finally, as shown in FIG. 4(H), the substrate is removed and release material layers are etched using a suitable etchant 490, thereby releasing the spring island and forming released spring finger 220 (discussed above in detail with reference to FIG. 3). Note that the release procedure is performed after the substrate/spring is mounted on exposed conductor portion 129, thereby reducing the risk of damage to the release spring finger during the transfer process. Note also that, as shown in FIG. 4(H), released spring finger 220 has an anchor portion 222 (formerly second section 420-1B; FIG. 4(G)) that is electrically connected to exposed conductor portion 129 by way of a corresponding support portion 213 of inner frame 212, and by way of outer contact portion 215.

Figure 5:
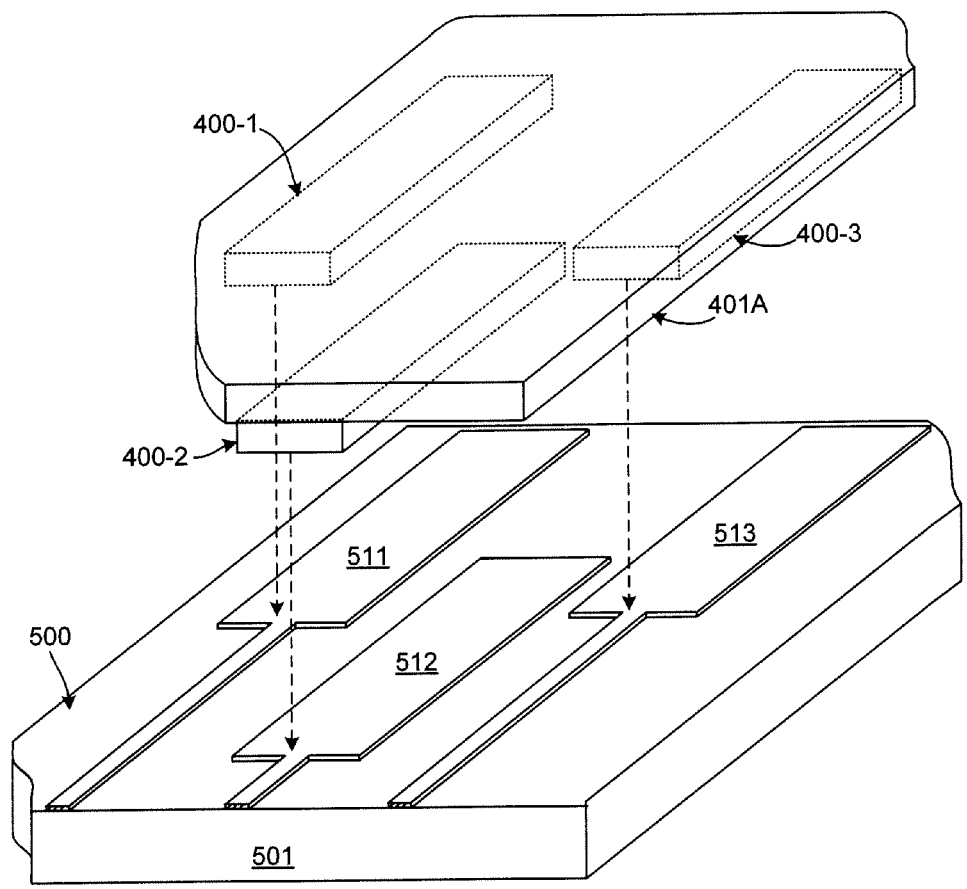
FIG. 5 is an exploded perspective view showing a method for mounting several micro spring structures on an apparatus according to another embodiment of the present invention.
Figure 6:
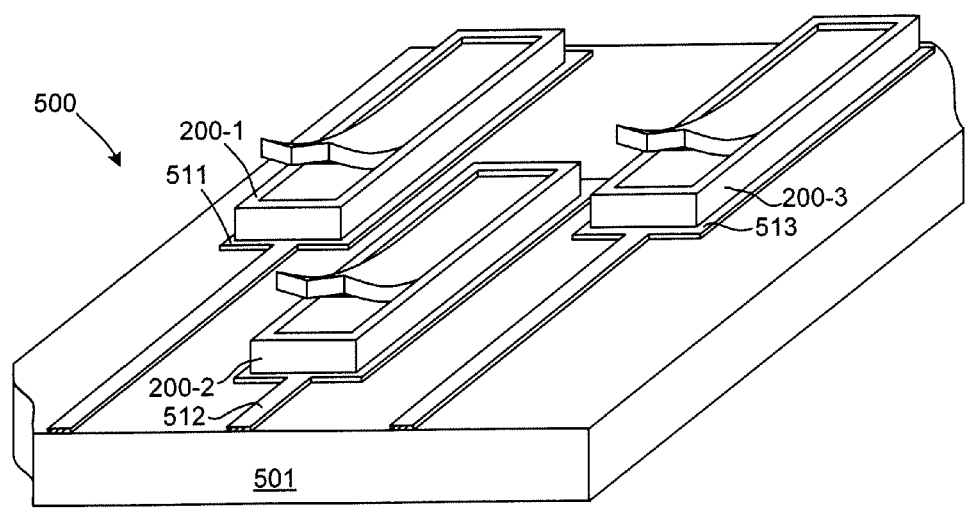
FIG. 6 is a perspective view showing the apparatus of FIG. 5 with the micro spring structures mounted thereon.

FIGS. 5 and 6 are perspective views showing a portion of a manufacturing process in which micro spring structures are mounted onto a substrate 501 of an apparatus 500 according to another specific example of the present invention. As indicated in the lower portion of FIG. 5, substrate 501 (e.g., an active integrated circuit or printed circuit board) includes several contact (e.g., copper) pads 511, 512 and 513 that are arranged in a predetermined pattern and connected to associated circuitry (not shown) by associated trace structures. As indicated in the upper portion of FIG. 5, several unreleased spring structures 400-1 through 400-3, each fabricated as described above, are arranged on a substrate 401A in a pattern that mirrors (matches) the predetermined pattern formed by contact pads 511-513. During the mounting process, unreleased spring structures are aligned with the contact pads (as indicated in FIG. 5), and then substrate is moved toward apparatus 500 such that each unreleased spring structures 400-1 through 400-3 contacts its corresponding contact pad 511-513, respectively, and then secured (e.g., using solder reflow techniques), and then the spring structures are released using the methods described above. The resulting apparatus 500 (shown in FIG. 6) is thereby produced with micro spring structure 200-1 through 200-3 attached to pads 511 through 513, respectively. Accordingly, the present invention provides a relatively simple and reliable method for producing apparatus 500 including a large number of electrically-isolated micro spring structures 200-1 through 200-3 without the need for separating the micro spring structures prior to the mounting process.

Although the present invention has been described with respect to certain specific embodiments, it will be clear to those skilled in the art that the inventive features of the present invention are applicable to other embodiments as well, all of which are intended to fall within the scope of the present invention. For example, instead of utilizing release material layer 410 (e.g., FIG. 4(A)), stress-engineered spring material film 420 (e.g., FIG. 4(B)) can be formed directly on substrate 401 (or via a relatively weak adhesive), and substrate separation/release may involve the separate steps of peeling, etching away, or otherwise removing substrate 401, and then etching second release material portion 450 to release the spring structure. Alternatively, different release materials may be utilized to form release material portions 410 and 450 (e.g., forming portion 410 using a relatively weak, sticky adhesive that facilitates easy removal of substrate 401, and a relatively strong release material for portion 450).

We claim:

1. An apparatus for transferring micro spring structures, the apparatus comprising:
   a substrate;
   a spring island attached to the substrate, wherein the spring island has stress gradient including a relatively tensile region and a relatively compressive region, the relatively tensile region being located between the substrate and the relatively compressive region;
   a second release material portion formed over a first portion of the spring island; and
   a base structure including a conductive frame formed on the second release material portion and a second portion of the spring island.

2. The apparatus of claim 1, further comprising a first release material portion formed between the spring island and the substrate.

3. The apparatus of claim 1, further comprising an adhesive layer formed between the spring island and the substrate.

4. The apparatus according to claim 1, wherein the spring island comprises molybdenum (Mo) and chromium (Cr), and wherein the first and second release material portions comprise titanium (Ti).

5. The apparatus according to claim 1, wherein the spring island comprises at least one of nickel (Ni), chromium (Cr), cobalt (Co), rhodium (Rh), gold (Au), copper (Cu) tin (Sn), zinc (Zn), and palladium (Pd).

6. The apparatus according to claim 1, wherein the base structure comprises Ni—Au strips formed on the second release material portion of release material and said second portion of the spring island, and a solder layer formed on the Ni—Au strips.

7. The apparatus according to claim 1, wherein the base structure further comprises an outer contact portion formed on the frame.

8. The apparatus according to claim 7, wherein the outer contact portion comprises solder.

9. An assembly for simultaneously forming a plurality of micro springs on a target apparatus, the target apparatus including a plurality of contact pads arranged in a predetermined pattern, the assembly including a plurality of unreleased micro spring structures disposed on a substrate, each said unreleased micro spring structure comprising:
   a spring island attached to the substrate, wherein the spring island has stress gradient including a relatively tensile region and a relatively compressive region, the relatively tensile region being located between the substrate and the relatively compressive region;
   a second release material portion formed over a first portion of the spring island; and
   a base structure formed over the second release material portion and a second portion of the spring island,
   wherein said plurality of unreleased micro spring structures are arranged in said predetermined pattern such that when the assembly is mounted onto the target apparatus, the base structure of said each unreleased micro spring structure contacts a corresponding contact pad of the plurality of contact pads, and
   wherein the base structure of said each unreleased micro spring structure comprises a conductive frame formed on the second release material portion and a second portion of the spring island.

10. The assembly of claim 9, wherein said each unreleased micro spring structure further comprises a first release material portion formed between the spring island and the substrate.

11. The assembly of claim 9, wherein said each unreleased micro spring structure further comprises an adhesive layer formed between the spring island and the substrate.

12. The assembly of claim 9, wherein the spring island of said each unreleased micro spring structure comprises molybdenum (Mo) and chromium (Cr), and wherein the first and second release material portions of said each unreleased micro spring structure comprise titanium (Ti).

13. The assembly of claim 9, wherein the spring island of said each unreleased micro spring structure comprises at least one of nickel (Ni), chromium (Cr), cobalt (Co), rhodium (Rh), gold (Au), copper (Cu) tin (Sn), zinc (Zn), and palladium (Pd).

14. The assembly of claim 9, wherein the base structure of said each unreleased micro spring structure comprises Ni—Au strips formed on the second release material portion of release material and said second portion of the spring island, and a solder layer formed on the Ni—Au strips.

15. The assembly according to claim 9, wherein the base structure of said each unreleased micro spring structure further comprises an outer contact portion formed on the frame.

16. The assembly according to claim 15, wherein the outer contact portion of said each unreleased micro spring structure comprises solder.

17. An apparatus comprising:
a substrate;
a plurality of contact pads arranged in a predetermined pattern on the substrate; and
a plurality of micro spring structures disposed on a substrate such that each said micro spring structure is mounted onto a corresponding contact pad of said plurality of contact pads, wherein each micro spring structure comprises:
　a base structure including an outer contact portion secured to said corresponding contact pad, and an inner frame disposed inside of the outer contact portion; and
　a spring finger having an anchor portion attached to a support portion of the inner frame such that the anchor portion extends parallel to the substrate, and a free portion having a curved shape and arranged such that a tip of said free portion is directed away from the substrate.

18. The apparatus of claim 17, wherein the spring finger of each said micro spring structure comprises at least one of molybdenum (Mo), chromium (Cr), nickel (Ni), cobalt (Co), rhodium (Rh), gold (Au), copper (Cu), tin (Sn), zinc (Zn), and palladium (Pd).

19. The apparatus according to claim 17, wherein the inner frame of the base structure of each said micro spring structure comprises Ni—Au strips, and wherein the outer contact portion of the base structure comprises a solder layer.

20. The apparatus according to claim 17, wherein the base structure of each said micro spring structure is soldered to the corresponding contact pad of said plurality of contact pads.

* * * * *